(12) United States Patent
Huang et al.

(10) Patent No.: US 9,349,588 B2
(45) Date of Patent: May 24, 2016

(54) METHOD FOR FABRICATING QUASI-SOI SOURCE/DRAIN FIELD EFFECT TRANSISTOR DEVICE

(71) Applicant: PEKING UNIVERSITY, Beijing (CN)

(72) Inventors: Ru Huang, Beijing (CN); Jiewen Fan, Beijing (CN); Ming Li, Beijing (CN); Yuancheng Yang, Beijing (CN); Haoran Xuan, Beijing (CN); Hanming Wu, Beijing (CN); Weihai Bu, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 0 days.

(21) Appl. No.: 14/787,261

(22) PCT Filed: Mar. 31, 2014

(86) PCT No.: PCT/CN2014/074360
§ 371 (c)(1),
(2) Date: Oct. 26, 2015

(87) PCT Pub. No.: WO2015/089951
PCT Pub. Date: Jun. 25, 2015

(65) Prior Publication Data
US 2016/0118245 A1 Apr. 28, 2016

(30) Foreign Application Priority Data
Dec. 18, 2013 (CN) .......................... 2013 1 0697719

(51) Int. Cl.
*H01L 21/00* (2006.01)
*H01L 21/02* (2006.01)
(Continued)

(52) U.S. Cl.
CPC .... *H01L 21/02271* (2013.01); *H01L 21/31051* (2013.01); *H01L 21/31105* (2013.01); *H01L 29/0847* (2013.01); *H01L 29/12* (2013.01); *H01L 29/66477* (2013.01)

(58) Field of Classification Search
CPC ................ H01L 21/02271; H01L 29/0847; H01L 29/12; H01L 29/66477; H01L 21/31051; H01L 21/31105

USPC ......................................................... 438/151
See application file for complete search history.

(56) References Cited

U.S. PATENT DOCUMENTS 8,598,003 B2 * 12/2013 Murtthy ................ 257/E21.431
2006/0084235 A1    4/2006 Barr et al.
(Continued)

FOREIGN PATENT DOCUMENTS

CN           102543826 A      7/2012
CN           102842493 A      12/2012
(Continued)

OTHER PUBLICATIONS

International Search Report (ISA/CN) for International Application No. PCT/CN2014/074360, mailed Aug. 20, 2014, 4 pages.

*Primary Examiner* — Thanh T Nguyen
(74) *Attorney, Agent, or Firm* — Foley & Lardner LLP; Antoinette F. Konski

(57) ABSTRACT

The present invention discloses a method for fabricating a quasi-SOI source/drain field effect transistor device, which comprises the steps of forming an active region of the device; forming a gate stack structure of the device; doping a source/drain extension region, and forming a first layer of side wall at two sides of the gate stack structure; forming a recessed source/drain structure; forming a quasi-SOI source/drain isolation layer; in-situ doping an epitaxial second semiconductor material source/drain, and activating by annealing; removing the previous dummy gate and re-depositing a high-k metal gate, if a post-gate process is employed; and forming contacts and metal interconnections. The method of the invention is well compatible with the existing CMOS process, and it has the features of simple process and small heat budget; and in comparison with the traditional field effect transistor, by means of the quasi-SOI source/drain field effect transistor device fabricated according to the method of the invention, the leakage current can be lowered effectively, thus the power consumption of the device can be reduced.

10 Claims, 7 Drawing Sheets

(51) Int. Cl.
*H01L 29/08* (2006.01)
*H01L 29/12* (2006.01)
*H01L 29/66* (2006.01)
*H01L 21/3105* (2006.01)
*H01L 21/311* (2006.01)

(56) References Cited

U.S. PATENT DOCUMENTS

2010/0314687 A1* 12/2010 Xu .................... H01L 21/28088
257/369
2013/0320457 A1* 12/2013 Lim ...................... H01L 27/092
257/369
2014/0183642 A1* 7/2014 Liang .............. H01L 21/823412
257/368
2015/0108430 A1* 4/2015 Cheng ............... H01L 29/66795
257/20

FOREIGN PATENT DOCUMENTS

| CN | 103151269 A | 6/2013 |
| CN | 103426907 A | 12/2013 |
| CN | 103681355 A | 3/2014 |

* cited by examiner

Silicon Oxide        Silicon Nitride        Silicon

Polysilicon        Aluminium        Silicon Germanium

Hafnium Oxide        Titanium Nitride        Aluminium Oxide

METHOD FOR FABRICATING QUASI-SOI SOURCE/DRAIN FIELD EFFECT TRANSISTOR DEVICE

CROSS-REFERENCE TO RELATED APPLICATIONS

This application is a U.S. national stage application under 35 U.S.C. §371 of International Application No. PCT/CN2014/074360, filed Mar. 31, 2014, which in turn claims priority of Chinese Patent Application No. 201310697719.0, filed Dec. 18, 2013, the content of each of which is incorporated herein by reference in its entirety.

FIELD OF THE INVENTION

The present invention relates to the field of ultra-large scale integrated circuit manufacturing technologies, and in particular, to a method for fabricating a quasi-SOI source/drain field effect transistor device.

BACKGROUND OF THE INVENTION

At present, the semiconductor manufacturing industry develops rapidly under the guidance of Moore's law. It is needed to reduce the power consumption as much as possible while increasingly improving the performance and integration density of the integrated circuit. It is a focus of the future semiconductor manufacturing industry to fabricate ultra-short channel devices having high-performance and low-power consumption. After entering the 22-nanometer technical node, in order to overcome the above problems, a quasi-SOI source/drain device is employed to greatly reduce the leakage current and lower the power consumption of the device, which gradually gains wide attentions. However, the existing fabricating processes of the quasi-SOI source/drain device are limited to be performed on a silicon substrate material and not yet extended to the high-mobility semiconductor substrates such as germanium, Group III-V materials. Moreover, in the existing fabricating processes, a quasi-SOI isolation layer is formed via thermal oxidation. As a result, a high heat budget is caused and the fabricating process is complicated, thus it cannot be well applied to the large-scale integrated manufacturing.

SUMMARY OF THE INVENTION

Directed to a high-performance and low-power consumption ultra-short channel device, the invention provides a method for fabricating a quasi-SOI source/drain field effect transistor device. The solution is compatible with the traditional CMOS process, thus it can be very easily integrated into the process flow; at the same time, the heat budget is small, thus it can be applied to semiconductor materials including germanium, silicon germanium and Group III-V semiconductor materials, in addition to silicon.

The method for fabricating a quasi-SOI source/drain field effect transistor device includes the steps of:

I) forming an active region of the device on a first semiconductor material, which functions as a substrate, via an isolation technology;

II) depositing a gate dielectric layer and a gate material layer sequentially on the substrate, and forming a gate stack structure of the device via a pre-gate process or a post-gate process, wherein the gate stack structure formed via the pre-gate process is a real gate, and the gate stack structure formed via the post-gate process is a dummy gate;

III) doping a source/drain extension region via implantation technology, and forming a first layer of side wall, with a width of L1, at two sides of the gate stack structure;

IV) forming a U-type, Σ-type or S-type recessed source/drain structure;

V) depositing a quasi-SOI source/drain isolation layer via chemical vapor deposition (CVD) technology, next planarizing the quasi-SOI source/drain isolation layer via chemical mechanical polishing (CMP) technology to stop at the gate material layer, and then forming a quasi-SOI source/drain isolation layer with a thickness of H4 on the recessed source/drain structure by etching back the quasi-SOI source/drain isolation layer via anisotropic dry etching or via isotropic wet etching, wherein the material of the quasi-SOI source/drain isolation layer is different from the material of the first layer of side wall;

VI) forming a source/drain by ins-itu doping an epitaxial second semiconductor material and activating by annealing;

VII) if the pre-gate process is employed in step II, directly proceeding to step VIII; and if the post-gate process is employed, removing the gate stack structure that functions as a dummy gate sacrificial layer and re-depositing a high-k metal gate, which includes first removing the dummy gate sacrificial layer via wet etching, next re-forming a gate dielectric layer having a high dielectric constant via atomic layer deposition (ALD), then re-forming the gate material layer via atomic layer deposition or physical vapor deposition (PVD), and finally planarizing the gate material layer via chemical mechanical polishing technology; and VIII) forming contacts and metal interconnections, so that the fabrication of the quasi-SOI source/drain silicon field effect transistor device is completed.

In the step I of the above method for fabricating the quasi-SOI source/drain field effect transistor device, the first semiconductor material is a Group IV semiconductor material or a Group III-V semiconductor material, wherein the Group IV semiconductor material is silicon, germanium or silicon germanium, and the Group III-V semiconductor material is gallium arsenide or indium arsenide.

The isolation technology in the step I of the above method for fabricating the quasi-SOI source/drain field effect transistor device is field oxidation isolation (LOCOS isolation), and the material is an oxide of the substrate formed by field oxidation; or the isolation technology is shallow trench isolation technology (STI isolation), and the material is an isolation material filled back in the shallow trench, which includes silicon oxide or silicon nitride deposited via chemical vapor deposition technology.

In the step II of the method for fabricating the quasi-SOI source/drain field effect transistor device, if the gate stack structure is a real gate, it will be reserved to the end; if the gate stack structure is a dummy gate, it will be finally removed as a sacrificial layer, and a high-k metal gate stack will be re-deposited; the material of the gate dielectric layer is an oxide or an oxynitride of the substrate formed via oxidation and subsequent annealing, or is a high-dielectric material deposited via atomic layer deposition technology, or is a mixture of the oxide or oxynitride of the substrate and the high-dielectric material; and the gate material layer is polysilicon formed via chemical vapor deposition technology or is a conductive material formed via atomic layer deposition or physical vapor deposition, and the conductive material is titanium nitride, tantalum nitride, titanium or aluminium.

In the step III of the method for fabricating the quasi-SOI source/drain field effect transistor device, the implantation technology employed for forming a doped structure of the source/drain extension region is beam ion implantation technology, plasma doping technology or monomolecular layer depositing and doping technology; and the material of the first layer of side wall at two sides of the gate stack structure may be silicon nitride, which is formed via CVD and anisotropic dry etching.

In the step IV of the method for fabricating the quasi-SOI source/drain field effect transistor device, the recessed source/drain structure is a U-type recessed source/drain structure, a Σ-type recessed source/drain structure or an S-type recessed source/drain structure, wherein the U-type recessed source/drain structure is formed by etching a first semiconductor substrate material via anisotropic dry etching, with an etching depth of H1; the Σ-type recessed source/drain structure is formed by continuing to etch the first semiconductor substrate via anisotropic wet etching on the basis of the U-type recessed source/drain structure via a TMAH solution, with a etching depth of H2, where H2 is greater than H1; the S-type recessed source/drain structure is formed by first forming a second layer of side wall with a width of L2 via CVD and anisotropic dry etching on the basis of the U-type recessed source/drain structure, etching the first semiconductor substrate via isotropic dry etching with a longitudinal etching depth of H3 and a transversal etching width of L3 that is greater than L2, and then removing the second layer of side wall via isotropic wet etching, wherein the material of the second layer of side wall is different from that of the first layer of side wall and has a anisotropic dry etching selection ratio of above 1:5 to the first semiconductor material.

The etching depth of the U-type recessed source/drain structure is H1; the etching depth of the Σ-type recessed source/drain structure is H1+H2; the etching depth of the S-type recessed source/drain structure is H1+H3; and the height H4 of the quasi-SOI source/drain isolation layer is less than the etching depth of the recessed source/drain structure, so that a window is reserved for the recessed source/drain extension region, and subsequently, an epitaxial process can be performed to form source/drain contacts.

In comparison with the U-type recessed source/drain structure, the source/drain extension region in the Σ-type recessed source/drain structure can be better surrounded by the quasi-SOI source/drain isolation material to be formed subsequently, thus the leakage current is smaller; if the source/drain subsequently formed by epitaxy employs a second semiconductor material, the Σ-type recessed source/drain structure can better conduct the stress generated by the epitaxial second semiconductor material source/drain to the first semiconductor material channel, thus the mobility is higher. In comparison with the U-type recessed source/drain structure, the source/drain extension region in the S-type recessed source/drain structure can be better surrounded by the quasi-SOI source/drain isolation material to be formed subsequently, thus the leakage current is smaller.

In the step V of the method for fabricating the quasi-SOI source/drain field effect transistor device, the material of the quasi-SOI source/drain isolation layer is different from that of the first layer of side wall, and silicon oxide or aluminium oxide which has a better heat conductivity may be selected.

In the step VI of the method for fabricating the quasi-SOI source/drain field effect transistor device, the material of the in-situ doped epitaxial second semiconductor is the same as or different from that of the first semiconductor; for a CMOS source/drain formed by in-situ doping the epitaxial second semiconductor material, P-type doping is performed for PMOS or N-type doping is performed for NMOS. There exist various annealing and activating modes, including furnace annealing, rapid thermal annealing, flash annealing, laser annealing or a combination thereof.

If the material of the in-situ doped epitaxial second semiconductor is different from that of the first semiconductor, a stress can be generated by the different lattice sizes between different semiconductors, thus the mobility of the first semiconductor material channel is increased; for example, a SiGe source/drain is employed for PMOS of silicon, and a SiC source/drain is employed for NMOS of silicon.

Taking a silicon substrate as an example, the technical solution for fabricating a quasi-SOI source/drain silicon field effect transistor device according to the invention includes the steps of:

A. Forming an active region of the device via STI isolation technology:
  a) forming a first layer of silicon oxide on a silicon substrate via thermal oxidation as a buffer layer for silicon nitride;
  b) depositing a first layer of silicon nitride on the first layer of silicon oxide via low-pressure chemical vapor deposition (LPCVD) as a stop layer for CMP;
  c) etching the first layer of silicon nitride, the first layer of silicon oxide and the silicon substrate via photolithography and anisotropic dry etching to form an STI trench;
  d) forming a second layer of silicon oxide (Oxide Liner) in the STI trench via thermal oxidation as an STI backfill buffer layer;
  e) forming a third layer of silicon oxide via high-density plasma chemical vapor deposition (HDPCVD) as an STI trench backfill material;
  f) planarizing the third layer of silicon oxide via CMP to stop at the first layer of silicon nitride;
  g) removing the first layer of silicon nitride and the first layer of silicon oxide via isotropic wet etching;

B. Depositing a gate dielectric layer and a gate material layer, and forming a gate stack structure of the device via photolithography and etching technology:
  a) forming a fourth layer of silicon oxide on the silicon substrate via thermal oxidation as a dummy gate dielectric layer;
  b) depositing a first layer of polysilicon via low-pressure chemical vapor deposition (LPCVD) as a dummy gate material layer;
  c) depositing a second layer of silicon nitride via low-pressure chemical vapor deposition (LPCVD) as a gate hard mask layer;
  d) etching the second layer of silicon nitride, the first layer of polysilicon and the fourth layer of silicon oxide via photolithography and anisotropic dry etching to form a gate stack structure;

C. Doping a source/drain extension region, and forming a side wall at two sides of the gate stack structure:
  a) doping the source/drain extension region via implantation technology;
  b) forming a third layer of silicon nitride via low-pressure chemical vapor deposition (LPCVD) as the material of a first layer of side wall, with a deposition thickness of L1;
  c) forming the first layer of side wall, with a width of L1, at the two sides of the gate stack structure by etching the third layer of silicon nitride via anisotropic dry etching.

D. Forming a U-type recessed source/drain structure, a Σ-type recessed source/drain structure or an S-type recessed source/drain structure, in which:
  in a case of forming a U-type recessed source/drain structure:
  a) etching the silicon substrate via anisotropic dry etching, with an etching depth of H1, to form a U-type recessed source/drain structure;

in a case of forming a Σ-type recessed source/drain structure:
a) etching the silicon substrate via anisotropic dry etching, with an etching depth of H1;
b) etching the silicon substrate via anisotropic wet etching, with an etching depth of H2, where H2>H1, to form a Σ-type recessed source/drain structure;

and in a case of forming an S-type recessed source/drain structure:
a) etching the silicon substrate via anisotropic dry etching, with an etching depth of H1;
b) depositing a fifth layer of silicon oxide via LPCVD as the material of a second layer of side wall, with a deposition thickness of L2;
c) etching the fifth layer of silicon oxide via anisotropic dry etching to form the second layer of side wall with a width of L2, which protects the source/drain extension region from being removed by the subsequent isotropic dry etching process;
d) etching the silicon substrate via isotropic dry etching, with a longitudinal etching depth of H3 and a transversal etching width of L3, where L3>L2, to form an S-type recessed source/drain structure;
e) removing the fifth layer of silicon oxide (the second layer of side wall) via isotropic wet etching;

E. Forming a quasi-SOI source/drain isolation layer on the recessed source/drain structure:
a) forming a first layer of aluminium oxide via LPCVD as the material of the quasi-SOI source/drain isolation layer;
b) planarizing the first layer of aluminium oxide via CMP to stop at the second layer of silicon nitride (the gate hard mask layer);
c) etching the first layer of aluminium oxide via anisotropic dry etching to stop at the third layer of silicon oxide (STI silicon oxide);
d) etching the first layer of aluminium oxide via isotropic wet etching to form a quasi-SOI source/drain isolation layer with a thickness of H4, where, when the recessed source/drain structure is a U-type recessed source/drain structure, H4<H1; when the recessed source/drain structure is a Σ-type recessed source/drain structure, H4<H1+H2; and when the recessed source/drain structure is an S-type recessed source/drain structure, H4<H1+H3; the purpose of this step is to reserve a window the source/drain extension region, and subsequently, an epitaxy process can be performed to form source/drain contacts;

F. doping an epitaxial source/drain in situ and activating them by annealing:
a) performing in-situ doping to form an epitaxial P-type silicon germanium source/drain, by using the epitaxy window previously reserved for the source/drain extension region;
b) activating the impurities via laser annealing and rapid thermal annealing.

G. Removing the gate stack structure that previously functions as a dummy gate, and re-depositing a high-k metal gate:
a) depositing a sixth layer of silicon oxide via LPCVD as a $0^{th}$ isolation dielectric layer;
b) planarizing the sixth layer of silicon oxide, the second layer of silicon nitride and the third layer of silicon nitride via CMP to stop at the first layer of polysilicon (the gate material layer);
c) removing the first layer of polysilicon (the dummy gate material layer) via isotropic wet etching;
d) removing the fourth layer of silicon oxide (the dummy gate dielectric layer) via isotropic wet etching;
e) forming an interface layer via in-situ vapor oxidation;
f) forming a first layer of high-dielectric material (real gate dielectric layer) via ALD;
g) forming a first layer of metal work function (real gate work function adjusting layer) via ALD;
h) forming a first layer of metal gate (real gate material layer) via PVD;
i) planarizing the first layer of metal gate via CMP to stop at the sixth layer of silicon oxide;

H. Forming contacts and metal interconnections, and completing the fabrication of the quasi-SOI source/drain silicon field effect transistor device.

The invention has the following technical effects.

Directed to the high-performance and low-power consumption ultra-short channel device, the invention provides a method for fabricating a quasi-SOI source/drain field effect transistor device. The solution is compatible with the traditional CMOS processes, thus it can be easily integrated into the process flow; at the same time, the heat budget is small, thus it can be applied to semiconductor materials such as germanium, silicon germanium and Group III-V semiconductor materials, in addition to silicon. Therefore, it is applicable for the large-scale integrated circuit manufacturing.

BRIEF DESCRIPTION OF THE DRAWINGS

FIGS. 1-19 are structural representations of the specific implementation flow for fabricating an SOI source/drain silicon field effect transistor device according to the invention, in which:

FIG. 1 is a schematic diagram showing the structure formed after a first layer of silicon nitride is deposited as a CMP stop layer during the process of forming an active region of the device;

FIG. 2 is a schematic diagram showing the structure formed after the first layer of silicon nitride, a first layer of silicon oxide and a silicon substrate are etched to form an STI trench during the process of forming the active region of the device;

FIG. 3 is a schematic diagram showing the structure formed after the first layer of silicon nitride and the first layer of silicon oxide are removed via wet etching during the process of forming the active region of the device;

FIG. 4 is a schematic diagram showing the structure formed after gate stack materials and a gate hard mask material are deposited;

FIG. 5 is a schematic diagram showing the structure formed after a gate stack structure is formed;

FIG. 6 is a schematic diagram showing the structure formed after a source/drain extension region is doped and a first layer of side wall is formed at two sides of the gate stack structure;

FIG. 7 is a schematic diagram showing the structure formed after a U-type recessed source/drain structure is formed;

FIG. 8 is a schematic diagram showing the structure formed after a Σ-type recessed source/drain structure is formed;

FIG. 9 is a schematic diagram showing the structure formed after a second layer of side wall is formed during the forming of an S-type recessed source/drain structure;

FIG. 10 is a schematic diagram showing the structure formed after the S-type recessed source/drain structure is formed;

FIG. 11 is a schematic diagram showing the structure formed after the second layer of side wall is removed during the forming of the S-type recessed source/drain structure;

FIG. 12 is a schematic diagram showing the structure formed after a quasi-SOI source/drain isolation layer is formed on the U-type recessed source/drain structure;

FIG. 13 is a schematic diagram showing the structure formed after a quasi-SOI source/drain isolation layer is formed on the Σ-type recessed source/drain structure;

FIG. 14 is a schematic diagram showing the structure formed after a quasi-SOI source/drain isolation layer is formed on the S-type recessed source/drain structure;

FIG. 15 is a schematic diagram showing the structure formed after an epitaxial source/drain is doped in situ and activated by annealing;

FIG. 16 is a schematic diagram showing the structure formed after a sixth layer of silicon oxide, a second layer of silicon nitride and a third layer of silicon nitride are planarized via CMP to stop at a first layer of polysilicon during the process of re-depositing a high-k metal gate;

FIG. 17 is a schematic diagram showing the structure formed after the dummy gate is removed during the process of re-depositing the high-k metal gate;

FIG. 18 is a schematic diagram showing the structure formed after the high-k metal gate is re-formed; and FIG. 19 is a schematic diagram showing the structure formed after contacts and metal interconnections are formed;

In FIG. 1-FIG. 19:

1: Silicon Substrate; 2: First Layer of Silicon Oxide (Buffer Layer for Silicon Nitride); 3: First Layer of Silicon Nitride (Stop Layer for CMP); 4: STI Trench; 5: Second Layer of Silicon Oxide (STI Trench Backfill Buffer Layer) and Third Layer of Silicon Oxide (STI Trench Backfill Material); 6: Fourth Layer of Silicon Oxide (Dummy Gate Dielectric Layer); 7: First Layer of Polysilicon (Dummy Gate Material Layer); 8: Second Layer of Silicon Nitride (Gate Hard Mask Layer); 9: Third Layer of Silicon Nitride (First Layer of Side Wall); 10: U-Type Recessed Source/drain Structure; 11: Σ-Type Recessed Source/drain Structure; 12: Fifth Layer of Silicon Oxide (Second Layer of Side Wall); 13: S-Type Recessed Source/drain Structure; 14: First Layer of Aluminium Oxide (Quasi-SOI Source/drain Isolation Layer); 15: P-Type Silicon Germanium Source/Drain; 16: Sixth Layer of Silicon Oxide; 17: Silicon Oxide Interface Layer; 18: Hafnium Oxide Layer (Real Gate Dielectric Layer); 19: Titanium Nitride Layer (Real Gate Work Function Adjusting Layer); 20: Aluminium Layer (Real Gate Material Layer); 21: Aluminium Material (Forming Contacts and Metal Interconnections).

Figure 20:
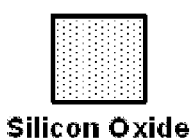
Figure 20:
Figure 20:
Figure 20:
Figure 20:
Figure 20:
Figure 20:
Figure 20:
Figure 20:

FIG. 20 is an illustration of the used materials.

DETAILED DESCRIPTION OF THE EMBODIMENTS

The invention will be illustrated in detail below by specific embodiments in conjunction with the drawings. A process solution for implementing the method for fabricating a quasi-SOI source/drain silicon field effect transistor device according to the invention is provided, which will not limit the scope of the invention in any way.

Figure 1:
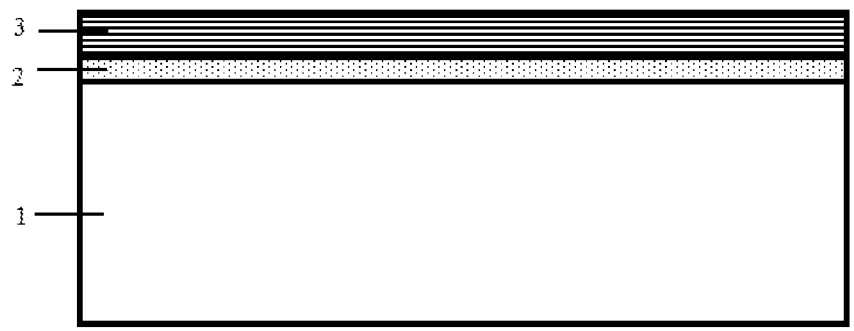
Figure 2:
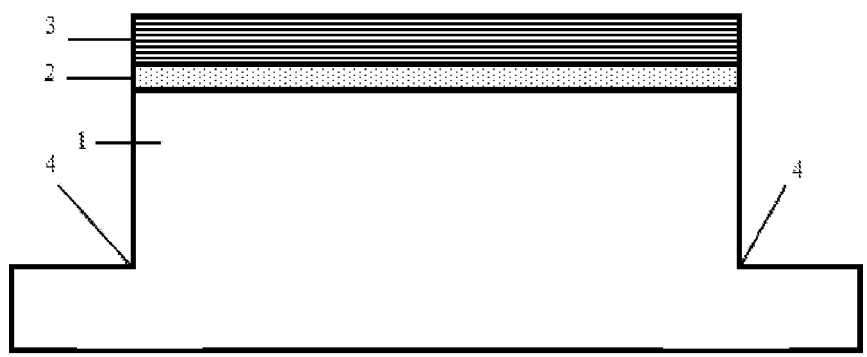
Figure 3:
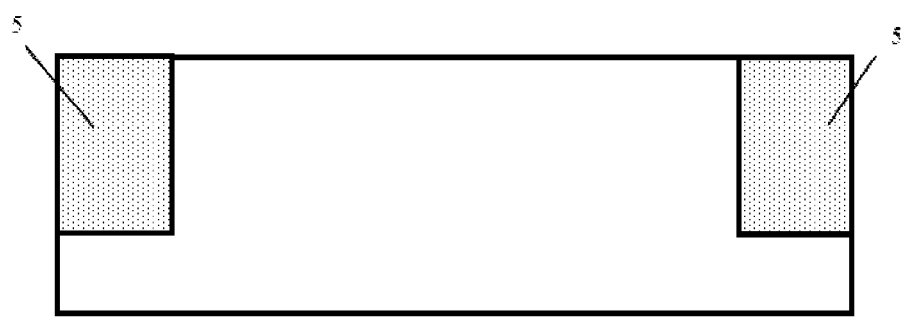
Figure 4:
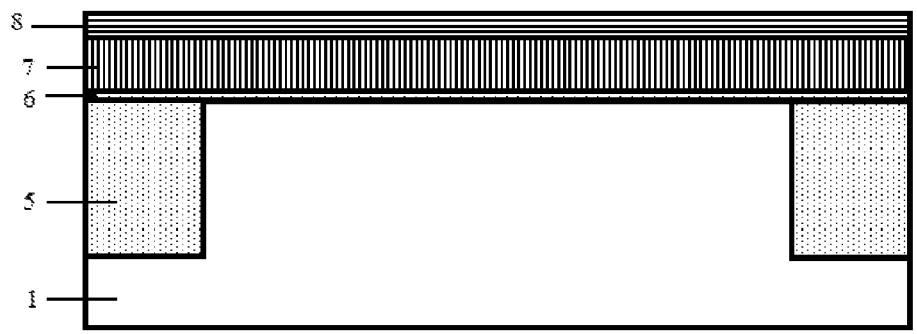
Figure 5:
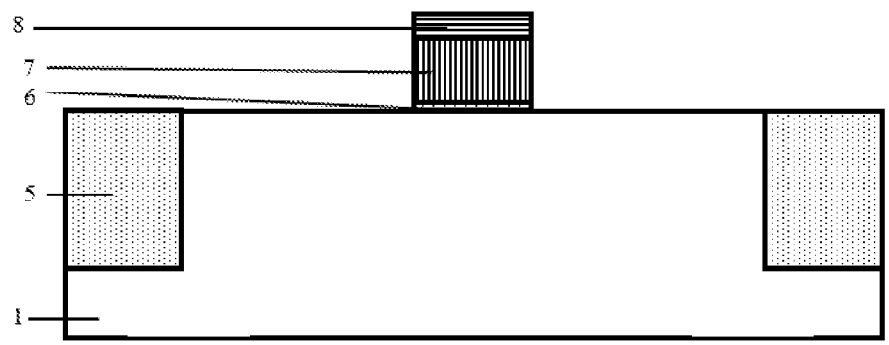
Figure 6:
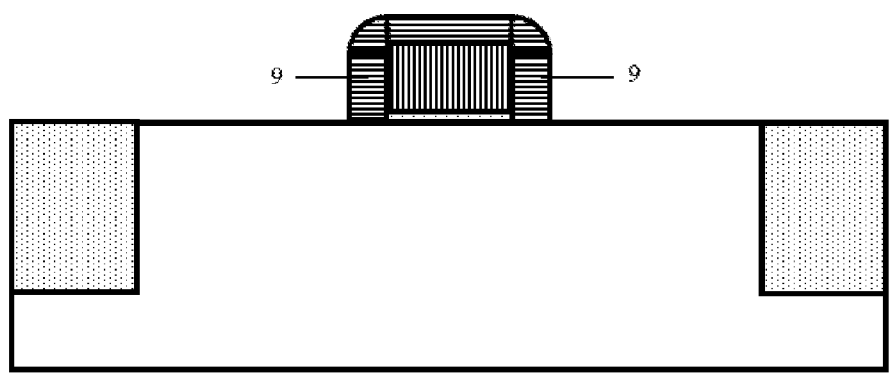
Figure 7:
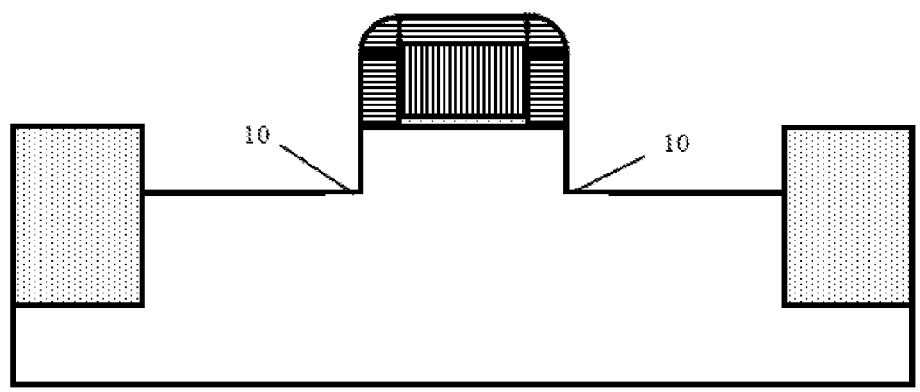
Figure 8:
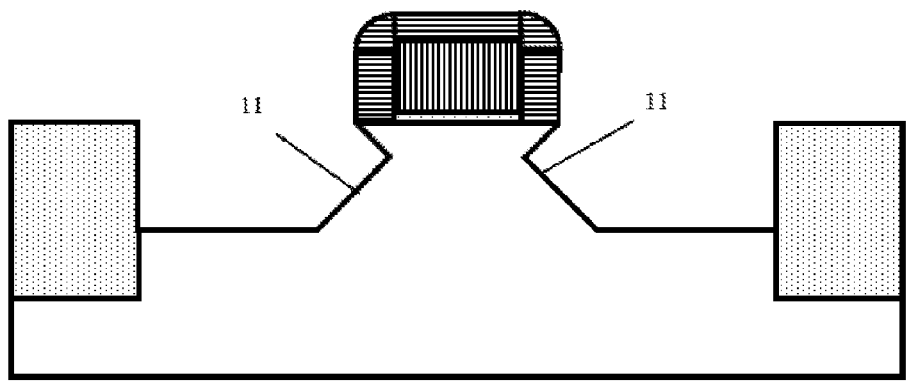
Figure 9:
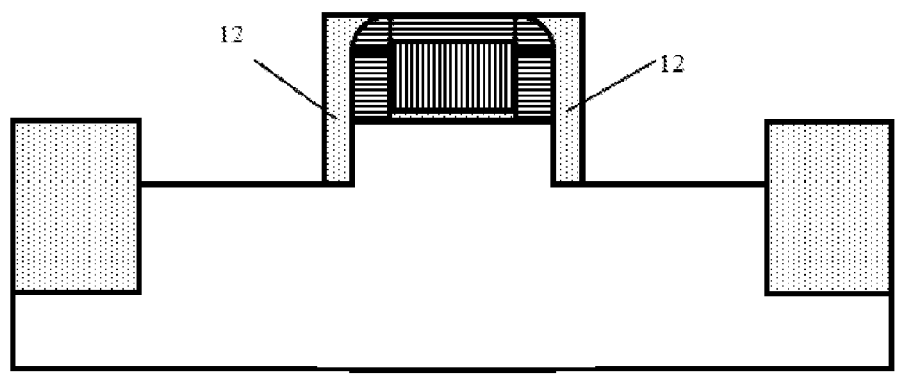
Figure 10:
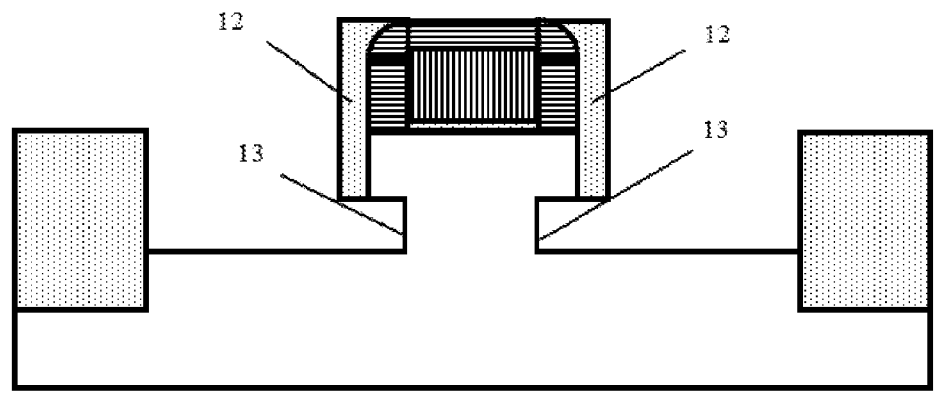
Figure 11:
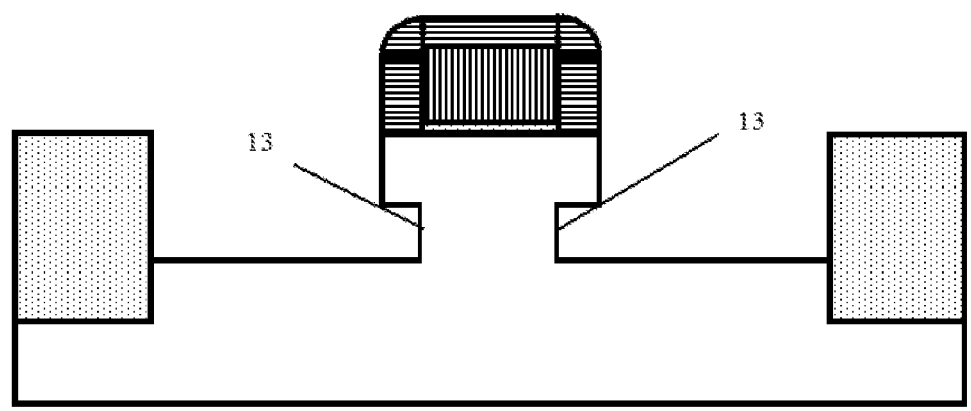
Figure 12:
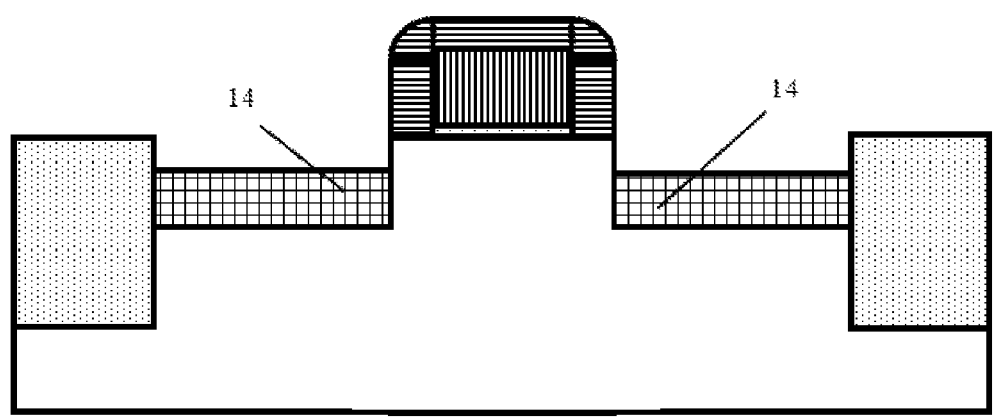
Figure 13:
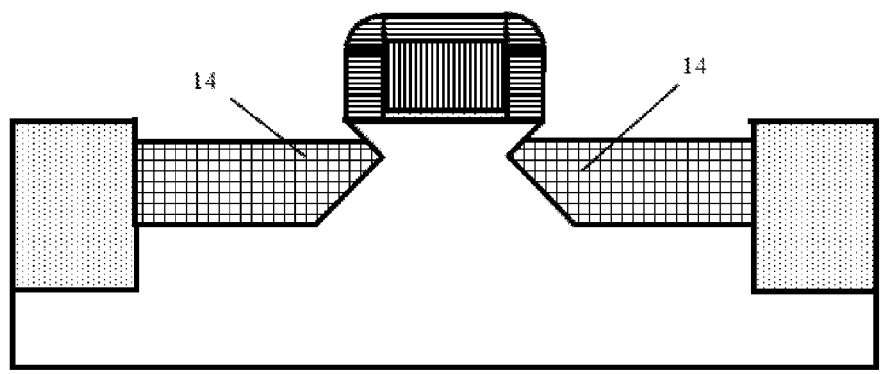
Figure 14:
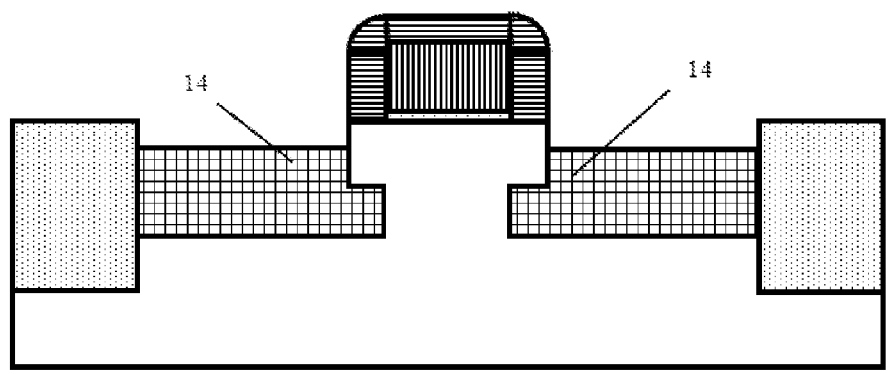
Figure 15:
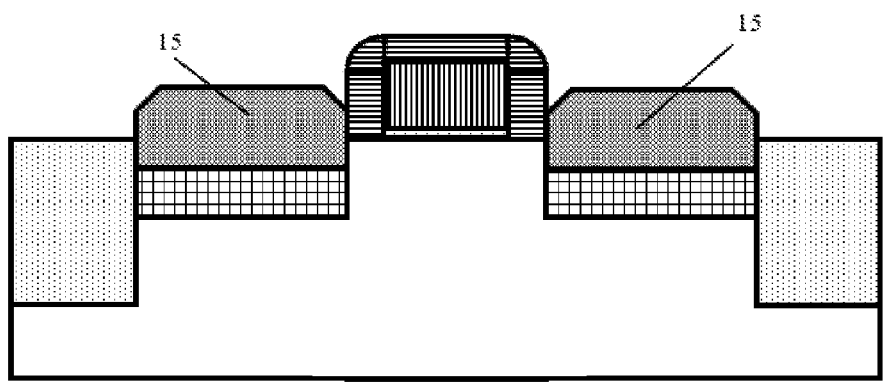
Figure 16:
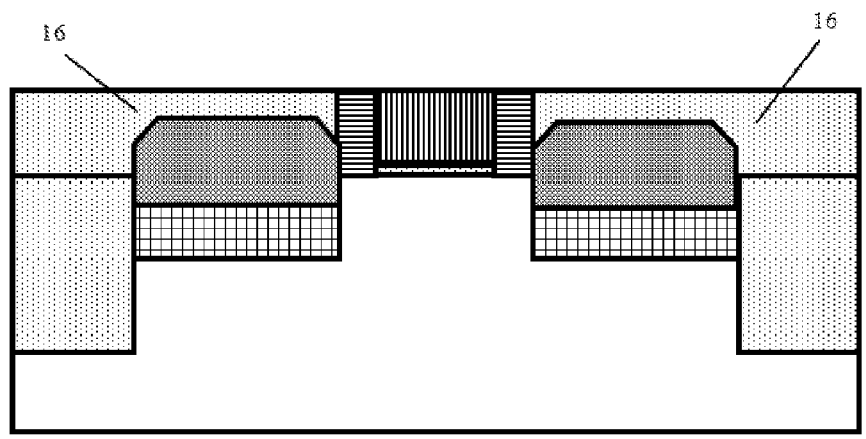
Figure 17:
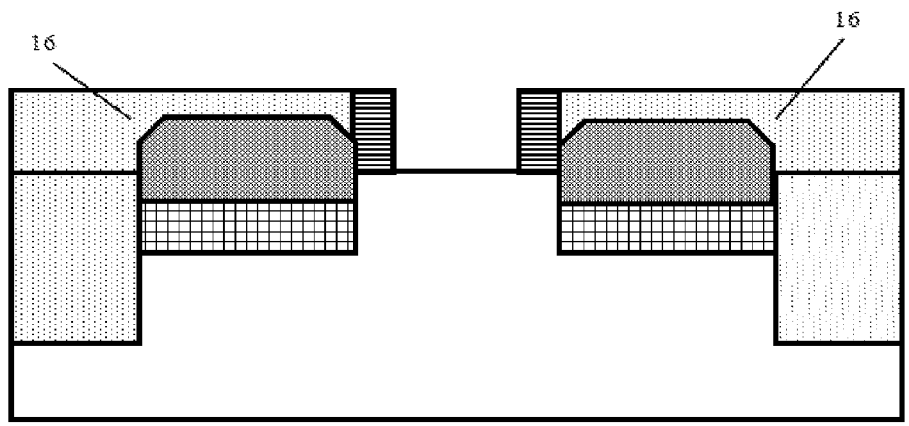
Figure 18:
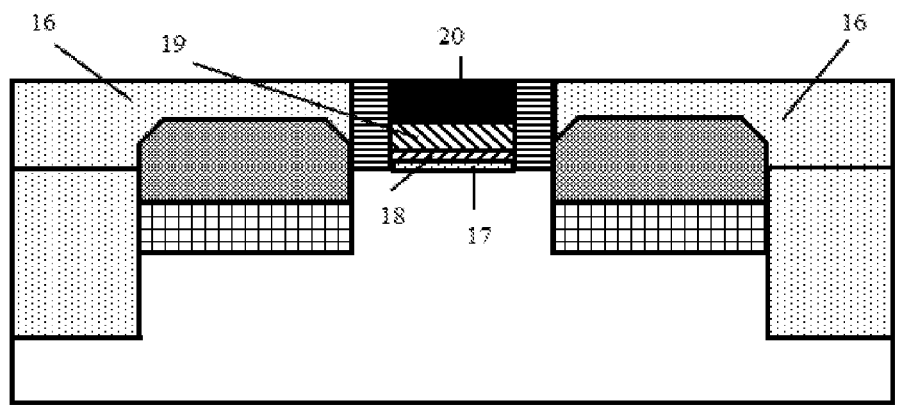
Figure 19:
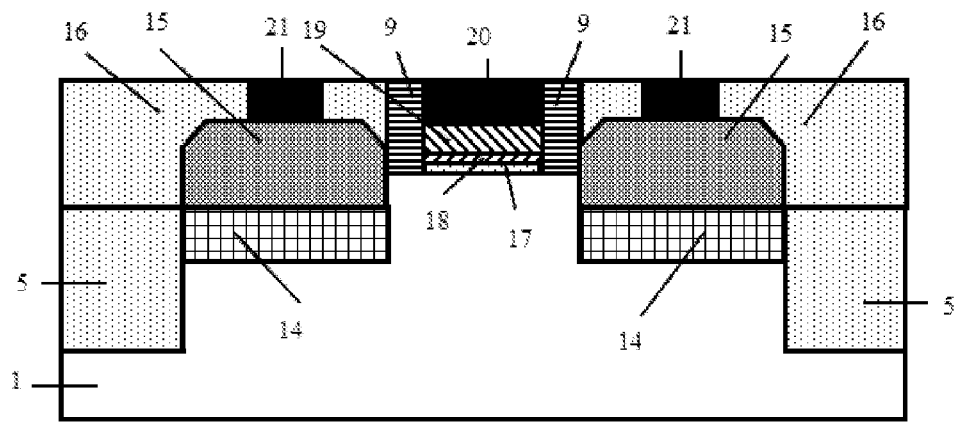

The specific implementation steps for fabricating a quasi-SOI source/drain silicon field effect transistor device by taking silicon as a substrate via a post-gate process are as follows:

I. Forming an active region of the device via STI isolation technology:

1. forming a 200 Å first layer of silicon oxide 2 on a silicon substrate 1 via thermal oxidation, as a buffer layer for silicon nitride;
2. forming a 600 Å first layer of silicon nitride 3 on the first layer of silicon oxide 2 via LPCVD, as a CMP stop layer, as shown in FIG. 1;
3. etching the 600 Å first layer of silicon nitride 3 and the 200 Å first layer of silicon oxide 2 and etching the silicon substrate 1 by 5000 Å to form a STI trench 4, via photolithography and anisotropic dry etching, as shown in FIG. 2;
4. forming a 100 Å second layer of silicon oxide 5 in the STI trench 4 via thermal oxidation, as an STI backfill buffer layer;
5. forming a 8000 Å third layer of silicon oxide via high-density plasma chemical vapor deposition (HDPCVD) as an STI trench backfill material;
6. planarizing the third layer of silicon oxide via CMP to stop at the first layer of silicon nitride 3;
7. removing the 600 Å first layer of silicon nitride 3 via isotropic wet etching by a concentrated phosphoric acid solution at 170° C., and removing the 200 Å first layer of silicon oxide 2 via isotropic wet etching by a hydrofluoric acid solution at a room temperature, as shown in FIG. 3;

II. Depositing a gate dielectric layer and a gate material layer, and forming a gate stack structure of the device via photolithography and etching technology:

8. forming a 50 Å fourth layer of silicon oxide 6 on the silicon substrate 1 via thermal oxidation, as a dummy gate dielectric layer;
9. forming a 1000 Å first layer of polysilicon 7 via LPCVD as a dummy gate material layer;
10. forming a 500 Å second layer of silicon nitride 8 via LPCVD as a gate hard mask layer, as shown in FIG. 4;
11. etching the 500 Å second layer of silicon nitride 8, the 1000 Å first layer of polysilicon 7 and the 50 Å fourth layer of silicon oxide 6 via photolithography and anisotropic dry etching to form a gate stack structure with a gate length of 30 nm, as shown in FIG. 5;

III. Doping a source/drain extension region, and forming a side wall at two sides of the gate stack structure:

12. implanting As into the source/drain extension region via the conventional beam ion implantation technology, with a dosage of $1e15\ cm^{-2}$, an energy of 5 keV and an angle of 0°, for doping;
13. forming a third layer of silicon nitride 9 via LPCVD, as the material of a first layer of side wall, with a deposition thickness of L1=300 Å;
14. etching the 300 Å third layer of silicon nitride 9 via anisotropic dry etching to form the first layer of side wall at the two sides of the gate stack structure, with a side wall width of L1=300 Å, as shown in FIG. 6;

IV. Forming a recessed source/drain structure, which may be a U-type recessed source/drain structure, a Σ-type recessed source/drain structure or an S-type recessed source/drain structure:

15. etching the silicon substrate 1 via anisotropic dry etching, with an etching depth of H1=300 Å, to form a U-type recessed source/drain structure 10, as shown in FIG. 7;
16. alternatively, forming a Σ-type recessed source/drain structure:
    a) etching the silicon substrate 1 via anisotropic dry etching, with an etching depth of H1=300 Å;
    b) etching the silicon substrate 1 via anisotropic wet etching, with an etching depth of H2=500 Å, where H2>H1, to form a Σ-type recessed source/drain structure 11, as shown in FIG. 8;

17. alternatively, forming an S-type recessed source/drain structure:
   a) etching the silicon substrate 1 via anisotropic dry etching, with an etching depth of H1=300 Å;
   b) forming a 300 Å fifth layer of silicon oxide 12 via LPCVD as the material of a second layer of side wall;
   c) etching the 300 Å fifth layer of silicon oxide 12 via anisotropic dry etching to form the second layer of side wall with a side wall width of L2=300 Å, which protects the source/drain extension region from being removed by the subsequent isotropic dry etching process, as shown in FIG. 9;
   d) etching the silicon substrate 1 via isotropic dry etching, with a longitudinal etching depth of H3=500 Å and a transversal etching width of L3=600 Å, where L3>L2, to form an S-type recessed source/drain structure 13, as shown in FIG. 10;
   e) removing the 300 Å fifth layer of silicon oxide 12, i.e., the second layer of side wall, via isotropic wet etching by a hydrofluoric acid solution, as shown in FIG. 11;

V. Forming a quasi-SOI source/drain isolation layer on the recessed source/drain structure:
18. forming a 5000 Å first layer of aluminium oxide 14 via LPCVD as the material of the quasi-SOI source/drain isolation layer;
19. planarizing the first layer of aluminium oxide 14 via CMP to stop at the second layer of silicon nitride 8, i.e., the gate hard mask layer;
20. etching the first layer of aluminium oxide 14 by 1550 Å via anisotropic dry etching to stop at the third layer of silicon oxide 5, i.e., the STI silicon oxide;
21. etching the first layer of aluminium oxide 14 by 200 Å via isotropic wet etching by a hydrochloric acid solution, with an etching depth less than H1, to form the quasi-SOI source/drain isolation layer with a thickness of H4, in which, for the U-type recessed source/drain structure, H4<H1, as shown in FIG. 12; for the Σ-type recessed source/drain structure, H4<H1+H2, as shown in FIG. 13; and for the S-type recessed source/drain structure, H4<H1+H3, as shown in FIG. 14;

VI. doping an epitaxial source/drain in situ and activating by annealing:
22. performing in-situ doping to form a 600 Å epitaxial P-type silicon germanium source/drain 15, by using an epitaxy window previously reserved for the source/drain extension region;
23. performing laser annealing at a temperature of 1200° C. for 1 ms;
24. performing rapid thermal annealing, with an initial temperature and a termination temperature of both 400° C., a peak temperature of 900° C., a temperature rising rate of 200° C./s and a temperature falling rate of 150° C./s, as shown in FIG. 15;

VII. Removing the previously formed dummy gate and re-depositing a high-k metal gate, in a case where a post-gate process (a gate replacement process) is employed:
25. forming a 5000 Å sixth layer of silicon oxide 16 via LPCVD as a 0$^{th}$ isolation dielectric layer;
26. planarizing the sixth layer of silicon oxide 16, the second layer of silicon nitride 8 and the third layer of silicon nitride 9 via CMP to stop at the first layer of polysilicon 7, i.e., the dummy gate material layer, as shown in FIG. 16;
27. removing the 1000 Å first layer of polysilicon 7, i.e., the dummy gate material layer, via isotropic wet etching by a TMAH solution;
28. removing the 50 Å fourth layer of silicon oxide 6, i.e., the dummy gate dielectric layer, via isotropic wet etching by a hydrofluoric acid solution, as shown in FIG. 17;
29. forming a 10 Å silicon oxide interface layer 17 via in-situ vapor oxidation;
30. depositing a first layer of high-dielectric material via ALD to form a 20 Å hafnium oxide layer 18, i.e., a real gate dielectric layer;
31. depositing a first layer of metal work function via ALD to form a 50 Å titanium nitride layer 19, i.e., a real gate work function adjusting layer;
32. depositing a first layer of metal gate 20 via PVD to form a 2000 Å aluminium layer 20, i.e., a real gate material layer;
33. planarizing the first layer of metal gate 20 via CMP to stop at the sixth layer of silicon oxide 16, as shown in FIG. 18;

VIII. Forming contacts and metal interconnections:
34. forming contacts and metal interconnections 21 so that the quasi-SOI source/drain silicon field effect transistor device is fabricated, as shown in FIG. 19.

The embodiments described above is not used for limiting the invention. Various variations and modifications may be made by one skilled in the art without departing from the spirit and scope of the invention. Therefore, the protection scope of the invention is defined by the appended claims.

What is claimed is:

1. A method for fabricating a quasi-SOI source/drain field effect transistor device, comprising the steps of:
   1) forming an active region of the device on a first semiconductor material, which functions as a substrate, via an isolation technology;
   2) depositing a gate dielectric layer and a gate material layer sequentially on the substrate, and forming a gate stack structure of the device via a pre-gate process or a post-gate process, wherein the gate stack structure formed via the pre-gate process is a real gate, and the gate stack structure formed via the post-gate process is a dummy gate;
   3) doping a source/drain extension region via implantation technology, and forming a first layer of side wall, with a width of L1, at two sides of the gate stack structure;
   4) forming a U-type, Σ-type or S-type recessed source/drain structure;
   5) depositing a quasi-SOI source/drain isolation layer via chemical vapor deposition technology, planarizing the quasi-SOI source/drain isolation layer via chemical mechanical polishing technology to stop at the gate material layer, and then forming a quasi-SOI source/drain isolation layer with a thickness of H4 on the recessed source/drain structure by etching back the quasi-SOI source/drain isolation layer via anisotropic dry etching or via isotropic wet etching, wherein the material of the quasi-SOI source/drain isolation layer is different from the material of the first layer of side wall;
   6) forming a source/drain by in-situ doping an epitaxial second semiconductor material and activating by annealing;
   7) if the pre-gate process is employed in step 2), directly proceeding to step 8); and if the post-gate process is employed, removing the gate stack structure that functions as a dummy gate sacrificial layer and re-depositing a high-k metal gate, including first removing the dummy gate sacrificial layer via wet etching, next re-forming a gate dielectric layer having a high dielectric constant via atomic layer deposition, then re-forming a gate material layer via atomic layer deposition or physical vapor deposition, and finally planarizing the gate material layer via chemical mechanical polishing technology;

8) forming contacts and metal interconnections, so that the fabrication of the quasi-SOI source/drain silicon field effect transistor device is completed.

2. The method for fabricating the quasi-SOI source/drain field effect transistor device according to claim 1, wherein the first semiconductor material is a Group IV semiconductor material or a Group III-V semiconductor material, and wherein the Group IV semiconductor material is silicon, germanium or silicon germanium, and the Group III-V semiconductor material is gallium arsenide or indium arsenide.

3. The method for fabricating the quasi-SOI source/drain field effect transistor device according to claim 1, wherein the isolation technology employed in the step 1) is field oxidation isolation, and the material is an oxide of the substrate formed by field oxidation; or the isolation technology is STI isolation, and the material is an isolation material filled back in the shallow trench, which includes silicon oxide or silicon nitride deposited via chemical vapor deposition technology.

4. The method for fabricating the quasi-SOI source/drain field effect transistor device according to claim 1, wherein if the gate stack structure in the step 2) is a real gate, it will be reserved to the end; if the gate stack structure is a dummy gate, it will be finally removed as a sacrificial layer, and a high-k metal gate stack will be re-deposited; the material of the gate dielectric layer is an oxide or an oxynitride of the substrate formed via oxidation and subsequent annealing, or is a high-dielectric material deposited via atomic layer deposition technology, or is a mixture of the oxide or oxynitride of the substrate and the high-dielectric material; and the gate material layer is polysilicon formed via chemical vapor deposition technology or is a conductive material formed via atomic layer deposition or physical vapor deposition, and the conductive material is titanium nitride, tantalum nitride, titanium or aluminium.

5. The method for fabricating the quasi-SOI source/drain field effect transistor device according to claim 1, wherein, the implantation technology employed for forming a doped structure of the source/drain extension region in the step 3) is beam ion implantation technology, plasma doping technology or monomolecular layer depositing and doping technology; and the material of the first layer of side wall at the two sides of the gate stack structure is silicon nitride, which is formed via chemical vapor deposition technology and anisotropic dry etching.

6. The method for fabricating the quasi-SOI source/drain field effect transistor device according to claim 1, wherein the recessed source/drain structure in the step 4) is a U-type, Σ-type or S-type recessed source/drain structure, and wherein the U-type recessed source/drain structure is formed by etching the substrate via anisotropic dry etching, with an etching depth of H1; the Σ-type recessed source/drain structure is formed by continuing to etch the substrate via anisotropic wet etching on the basis of the U-type recessed source/drain structure via a TMAH solution, with an etching depth of H2, where H2 is greater than H1; the S-type recessed source/drain structure is formed by first forming a second layer of side wall with a width of L2 via chemical vapor deposition technology and anisotropic dry etching on the basis of the U-type recessed source/drain structure, etching the substrate via isotropic dry etching with a longitudinal etching depth of H3 and a transversal etching width of L3 that is greater than L2, and then removing the second layer of side wall via isotropic wet etching, wherein the material of the second layer of side wall is different from that of the first layer of side wall and has a anisotropic dry etching selection ratio of above 1:5 to the first semiconductor material.

7. The method for fabricating the quasi-SOI source/drain field effect transistor device according to claim 1, wherein an etching depth of the U-type recessed source/drain structure is H1; an etching depth of the Σ-type recessed source/drain structure is H1+H2; an etching depth of the S-type recessed source/drain structure is H1+H3; and a height H4 of the quasi-SOI source/drain isolation layer is less than the etching depth of the recessed source/drain structure, so that a window is reserved for the recessed source/drain extension region.

8. The method for fabricating the quasi-SOI source/drain field effect transistor device according to claim 1, wherein the material of the quasi-SOI source/drain isolation layer in the step 5) is silicon oxide or aluminium oxide.

9. The method for fabricating the quasi-SOI source/drain field effect transistor device according to claim 1, wherein the second semiconductor material in the step 6) and the first semiconductor material in the step 1) are the same or different; for a CMOS source/drain formed by in-situ doping the epitaxial second semiconductor material, P-type doping is performed for PMOS or N-type doping is performed for NMOS; when the first semiconductor material is silicon, a silicon germanium source/drain is employed for PMOS, and a silicon carbon source/drain is employed for NMOS.

10. The method for fabricating the quasi-SOI source/drain field effect transistor device according to claim 1, wherein the annealing and activating in the step 6) is one or more selected from furnace annealing, rapid thermal annealing, flash annealing and laser annealing.

* * * * *